United States Patent [19]

Schulman, et al.

[11] Patent Number: 5,296,721

[45] Date of Patent: Mar. 22, 1994

[54] STRAINED INTERBAND RESONANT TUNNELING NEGATIVE RESISTANCE DIODE

[75] Inventor: Joel N. Schulman, Agoura; David H. Chow, Newbury Park, both of Calif.

[73] Assignee: Hughes Aircraft Company, Los Angeles, Calif.

[21] Appl. No.: 923,397

[22] Filed: Jul. 31, 1992

[51] Int. Cl.$^5$ .................... H01L 29/205; H01L 29/72
[52] U.S. Cl. .................... 257/25; 257/14; 257/18; 257/22; 257/23; 257/190
[58] Field of Search .................. 257/14, 18, 22, 23, 257/25, 188, 190, 201

[56] References Cited

U.S. PATENT DOCUMENTS

| | | | |
|---|---|---|---|
| 4,286,275 | 8/1981 | Heiblum | 357/12 |
| 4,439,782 | 3/1984 | Holonyak, Jr. | 357/17 |
| 4,780,749 | 10/1988 | Schulman . | |
| 5,113,231 | 5/1992 | Söderström | 257/25 |
| 5,132,746 | 7/1992 | Mendez et al. | 257/25 |

FOREIGN PATENT DOCUMENTS

| | | | |
|---|---|---|---|
| 0081007 | 6/1983 | European Pat. Off. | 357/12 |
| 59-67676 | 4/1984 | Japan | 357/4 |
| 59-90978 | 5/1984 | Japan | 357/4 |
| 61-84872 | 4/1985 | Japan | 357/4 |
| 1-171280 | 7/1989 | Japan | 257/25 |

OTHER PUBLICATIONS

J. Vac. Sci. Technol. B 8(4), Jul./Aug. 1990, "InAs/-Ga$_{1-x}$In$_x$Sb strained-layer superlattices grown by molecular-beam epitaxy", pp. 710-714, D. Chow et al.

J. R. Soderstrom et al., "New Negative Differential Resistance Device Based On Resonant Interband Tunneling," Appl. Phys. Lett. 55(11), Sep. 11, 1989, pp. 1094-1096.

D. Z.-Y. Ting et al., "Role of Heavy-Hole States in interband tunnel structures", Appl. Phys. Lett. 58(3) Jan. 21, 1991, pp. 292-294.

M. S. Kiledjian et al., "Hole and interband resonant tunneling in GaAs/GaAlAs and InAs/GaSb/AlSb tunnel structures", Surface Science, North-Holland, vol. 267, 1992, pp. 405-408.

Sollner et al., "Resonant Tunneling through quantum wells at frequencies up to 2.5 THz", 43 Appl Phys. Lett., Sep. 1983, pp. 585-590.

Neikirk et al, "Quantum-well devices will challenge HEMTs", Microwaves & RF, Jul. 1986, pp. 93-97.

Shen et al., "Photoreflectance Study of GaAs/AlAs Superlattices: Fit to Electromodulation Theory", 48 Appl. Phys. Lett., Mar. 1986, pp. 653-655.

Yokoyama et al, "A New Functional, Resonant-Tunneling Hot Electron Transistor (RHET)" Jap. Journal of Appl. Phys., vol. 24, No. 11, Nov. 1985, pp. 853-854.

Summers et al., "Variably Spaced Superlattice Energy Filter, A New Device Design Concept for High-Energy Electron Injection," Appl. Phys. Lett., 48(12) Mar. 24, 1986, pp. 806-808.

Kaede et al., "High Speed GaAs/AlGaAs Photoconductive Detector Using a P-Modulation-Doped Multi Quantum Well Structure", Appl. Phys. Lett., 48(16), Apr. 21, 1986, pp. 1096-1097.

Ray et al., "Resonant Tunneling Transport At 300K in GaAs-AlGaAs Quantum Wells Grown by Metallorganic Chemical Vapor Deposition", Appl. Phys. Lett., 48(24), Jun. 16, 1986, pp. 1666-1668.

Primary Examiner—Jerome Jackson
Attorney, Agent, or Firm—V. D. Duraiswamy; W. K. Denson-Low

[57] ABSTRACT

A double barrier tunnel diode (10) has a quantum well (12), a pair of electron injection layers (16) on either side of the quantum well (12), and a barrier layer (14) between each of the electron injection layers (16) and the quantum well (12), in a strained biaxial epitaxial relationship with the quantum well (12). The material of the quantum well (12) is chosen such that the biaxial strain is sufficient to reduce the energy of heavy holes in the quantum well (12) to less than the energy of the conduction band minimum energy of the electron injection layers (16). Preferably the quantum well (12) is made of gallium antimonide with from about 1 to about 40 atomic percent arsenic alloyed therein, the electron injection layers (16) are made of indium arsenide, and the barrier layers (14) are made of aluminum antimonide.

13 Claims, 1 Drawing Sheet

STRAINED INTERBAND RESONANT TUNNELING NEGATIVE RESISTANCE DIODE

BACKGROUND OF THE INVENTION

This invention relates to semiconductor diodes, and, more particularly, to a modified double barrier tunnel diode.

A diode is a semiconductor device having a nonlinear voltage-current relation. Diodes are among the most important of solid-state devices, and are used in many electronic applications. The tunnel diode is one variety of diode, having the unusual characteristic of negative resistance. As the term is used, negative resistance is a voltage-current behavior wherein, over certain voltage ranges, increasing the voltage applied across the diode leads to decreased current carried through the diode. By contrast, in most devices an increasing applied voltage results in increasing current. Tunnel diodes have a number of applications, including high frequency oscillator circuits and high frequency electronic switches.

One type of tunnel diode is the double barrier tunnel diode. One such double barrier tunnel diode includes a gallium antimonide quantum well with a thin barrier layer of aluminum antimonide epitaxially joined to each side of the quantum well. This structure, termed a quantum barrier, in turn lies between two injection layers of indium arsenide. The quantum barrier creates an energy barrier to the flow of electrons that can be overcome by electrons only under certain conditions, and which results in the negative resistance characteristic of interest over a range of applied bias voltage. Electrons are injected into the quantum barrier from the conduction band of one of the injection layers under an internal voltage, produced by the applied external voltage. The internal voltage increases the energy of the injected electrons to satisfy the resonant tunneling condition of the quantum barrier. Under the proper conditions of voltage sufficient to satisfy the resonance condition, the incoming electron has the same energy as a valence level of the quantum well, and the electrons tunnel through the quantum barrier. As the bias voltage is increased further, the energy levels no longer align and the current decreases, resulting in the negative resistance effect.

In some cases, it has been observed that the magnitude of the negative resistance effect is not as great as might be expected. It is important to understand the cause of this reduced negative-resistance effect, and an associated need for an improved double barrier tunnel diode that exhibits the full extent of the negative-resistance effect. The present invention fulfills this need, and further provides related advantages.

SUMMARY OF THE INVENTION

The present invention provides an improved double barrier tunnel diode. This diode avoids the reduced magnitude of the negative-resistance effect observed in some other similar diodes. It is structurally similar to conventional diodes, and can be substituted for conventional diodes.

In accordance with the invention, a double barrier tunnel diode comprises a quantum well having at least one layer of a semiconductor material. A pair of electron injection layers are disposed on either side of the quantum well, and a barrier layer is positioned between each of the electron injection layers and the quantum well. The barrier layers have a thickness sufficiently small to permit electrons to tunnel through the barriers and the quantum well. The barrier layers further have a biaxially strained epitaxial relationship with the material of the quantum well, the biaxial stress and strain being sufficient to reduce the energy of heavy holes in the quantum well to less than the energy of the conduction band minimum energy of the electron injection layers.

In a preferred approach, the quantum well is less than about 200 Angstroms thick and is made of gallium antimonide with from about 1 to about 40 atomic percent arsenic therein. The electron injection layers are made of indium arsenide. The barrier layers are each less than about 40 Angstroms thick and are made of aluminum antimonide. The application of the invention is not limited to this structure, however.

In the preferred structure, the arsenic addition decreases the lattice constant of the gallium antimonide of the quantum well. The arsenic addition is limited to an amount that will not cause the loss of coherency and the epitaxial interfacial structure, with the result that the quantum well is placed into biaxial tension. This tensile stress splits the energy levels of the heavy and light holes in the quantum well, and decreases the energy level of the heavy holes relative to the light holes. With a sufficient addition of the alloying element into the material of the quantum well, the energy level of the heavy holes is decreased sufficiently that it is below the conduction energy level of the injection layer.

Consequently, in the present approach the heavy holes do not enter into the quantum tunneling effect because a bias voltage raises the energy of the injected electrons even further above the energy of the heavy holes. Thus, only the light holes can contribute to the negative resistance effect, the desired result. It has been found that the heavy holes provide a competing channel for conduction to the desired light holes, and therefore the elimination of the heavy holes from the conduction process results in improved negative resistance performance of the diode.

The present diode is more effective than the conventional comparable diode in achieving a negative resistance effect. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
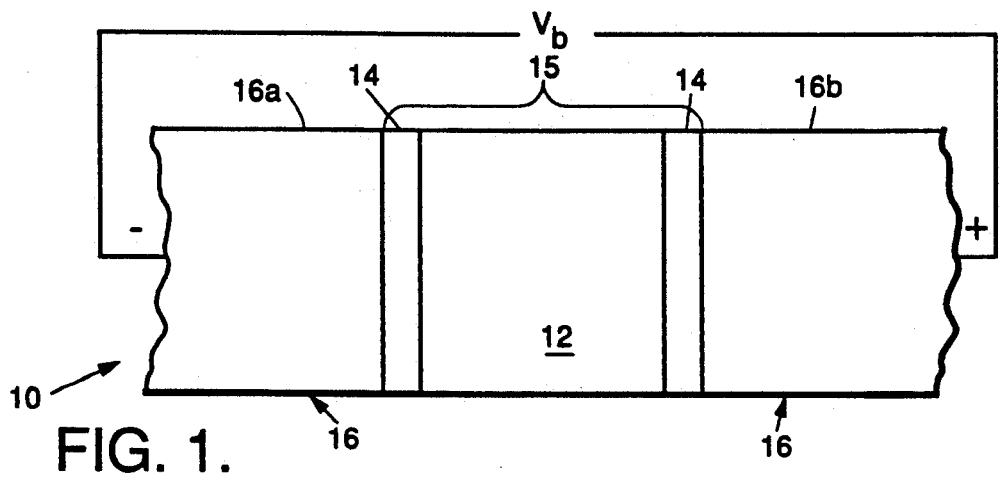
FIG. 1 is a schematic sectional view of a double barrier tunnel diode.

The present invention is embodied in a double barrier tunnel diode 10, illustrated in FIG. 1. Such a tunnel diode 10 includes a quantum well 12, bounded on each side by a barrier layer 14. The quantum well 12 and the two barrier layers 14 are together termed herein a quantum barrier 15. Disposed outwardly of the barrier layers 14, on either side of the quantum barrier 15, are a pair of injection layers 16. The diode 10 is prepared by depositing these layers sequentially.

In operation, electrons are supplied from one of the injection layers, here illustrated as injection layer 16a. Under the application of an external biasing voltage $V_b$, electrons from the injection layer 16a resonantly tunnel through the quantum barrier 15 to the other injection layer 16b. The result is a current through the quantum barrier 15 and the diode 10.

In one form of such a device known in the art, the quantum well is single crystal gallium antimonide (GaSb) of a thickness of less than about 200 Angstroms. The barrier layers 14 are single crystal aluminum antimonide (AlSb), each of a thickness of less than about 40 Angstroms. The injection layers 16 are single crystal indium arsenide. Other materials are used in such diodes, and the present invention is not limited to this composition.

The barrier layers 14 are in epitaxial relation to the quantum well 12, and the injection layers 16 are in epitaxial relation to the barrier layers 14. An "epitaxial" relation is one wherein the adjacent layers or structures have the same crystal structure and are crystallographically continuous between the two layers or structures. That the crystal structures are the same and continuous between the layers does not, however, imply that the lattice parameters of the two layers or structures are identical. In most cases, the lattice parameters are slightly mismatched, leading to a biaxial strain condition. The present invention does not attempt to reduce the biaxial strain, but takes the opposite approach of increasing the biaxial strain to control to advantage the electron energy state of the quantum well.

Biaxial strain is present when there is strain in two orthogonal directions in a material. Such biaxial strain often arises in other contexts when two materials with different lattice constants or coefficients of expansion are joined at an interface, so that stresses and strains are produced in each material in orthogonal directions parallel to the interface.

Figure 2:
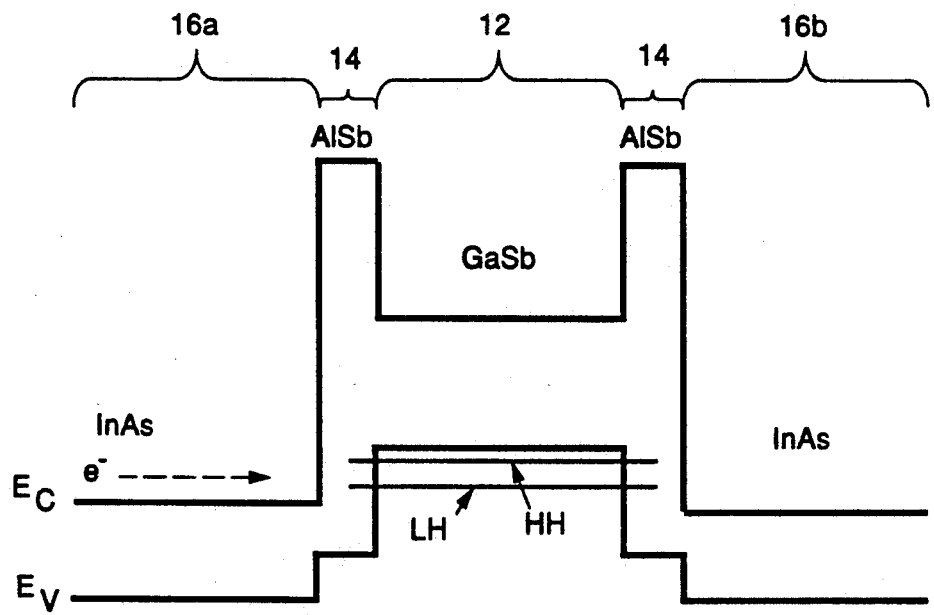
FIG. 2 is a schematic diagram of the structure of FIG. 1, with an indication of energy states in the conventional diode.

FIG. 2 depicts the relevant electron energy states for the diode of FIG. 1. The line indicated "E" represents the lowest electron energy states for the conduction band of each layer. The line indicated "E" represents the electron energy states for the valence band of each layer. Conduction through the diode 10 occurs when conduction band electrons injected from the injection layer 16a (under the influence of the bias voltage V of FIG. 1) tunnel through the barrier layer 14, are conducted through the quantum well 12 in the valence band, tunnel through the other barrier layer 14, and enter the conduction band of the injection layer 16b.

It has been observed that the electron movement in the valence state of the quantum well 13 can occur in multiple fine states that have been termed "heavy holes" and "light holes". The heavy holes and light holes have their own respective valence energy states, termed "HH" and "LH" in FIG. 2. The light hole resonance is desired for tunneling, because it has a strong transmission probability and resulting high current densities. Because of the symmetry mismatch between it and the incoming electron state, the heavy hole resonance does not transmit as well as does the light hole resonance. The presence of the heavy hole resonance is undesirable because it provides an alternate channel for transport which tends to degrade the negative resistance effect. Unfortunately, due to its greater mass, the heavy hole is always at a higher energy than the light hole resonance for this type of structure. Consequently, the application of a voltage $V_b$ will always result in interference from the heavy hole state as the device passes into the negative resistance region of its operation.

A key feature of the present invention is modifying the structure of the quantum well 12 to define the heavy hole energy state by splitting it from the light hole energy state. The heavy hole energy state is reduced to a level below that of the conduction band of the injection layer 16a and thence below the energy of the injected electrons from the injection layer 16a. This modification must be achieved while maintaining the epitaxial relationship between the barrier layer 14 and the quantum well layer 12.

Figure 3:
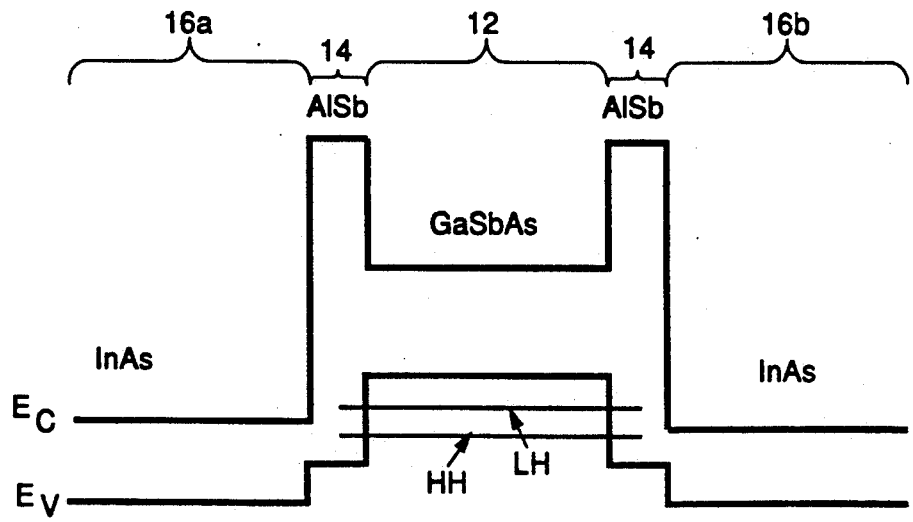
FIG. 3 is a schematic diagram of the structure of FIG. 1, with an indication of energy states in the diode of the invention.

In the preferred approach, the quantum well layer 12 is alloyed by the addition of an alloying element so that its lattice parameter is decreased. The decrease in the lattice parameter of the quantum well results in the creation of biaxial tensile stresses and strains in the quantum well layer 12. The epitaxial relationship with the barrier layer 14 and the lattice parameter of the barrier layer 14 remain unchanged. The compressive stress and strain state in the quantum well layer 12 selectively reduces the energy level of the heavy holes, as shown in FIG. 3. A sufficient addition of the alloying element is made to the quantum well material to increase the biaxial tensile stress and strain by an amount such that the energy level of the heavy holes is reduced below the minimum conduction band energy of the injection layer. With the energy level of the heavy holes so reduced, the heavy holes do not contribute to the resonant tunneling through the quantum barrier, and therefore do not affect the negative resistance region achieved when the voltage $V_b$ is further increased. Consequently, the modified diode exhibits an enhanced negative resistance effect as compared with the unmodified conventional diode.

According to the present approach, the quantum well layer is modified by adding an element that decreases its lattice constant. In the preferred case of a gallium antimonide quantum well, the preferred alloying element is arsenic. Arsenic is incorporated into the material of the quantum well during its growth, as by molecular beam epitaxy. The amount of arsenic added can vary over a limited range. The amount of arsenic must be sufficient to reduce the energy level of the heavy holes to below that of the conduction band of the injection layer, here indium arsenide. The minimum operable amount of arsenic is estimated to be about 1 atomic percent.

On the other hand, with increasing amounts of arsenic added to the gallium antimonide of the quantum well in a range of samples, the tensile strain increases so that, at some point, the system energy can be reduced by nucleating a defect and the epitaxial relationship is lost. The amount of arsenic added to the gallium antimonide of the quantum well must not be so great that the epitaxial relationship between the aluminum antimonide barrier layer 14 and the quantum well 12 is lost. The maximum amount of arsenic that may be added to the gallium antimonide of the quantum well is estimated to be about 40 atomic percent, although the exact value may depend upon the thickness of the quantum well.

Thus, for the preferred system with indium arsenide injection layers, aluminum antimonide barrier layers, and a gallium-antimonide-arsenide quantum well, the arsenic should remain within the range of from about 1 to about 40 atomic percent. For other selections of materials used to make a diode of similar structure, similar physical principles apply, but the numerical values will vary.

The present invention provides a double barrier tunnel diode of improved structure and operation in achieving the important negative resistance function. Although a particular embodiment of the invention has been described in detail for purposes of illustration, various modifications may be made without departing from the spirit and scope of the invention. Accordingly, the invention is not to be limited except as by the appended claims.

What is claimed is:

1. A double barrier tunnel diode, comprising:
   a quantum well having at least one layer of a semiconductor material;
   a pair of electron injection layers on either side of the quantum well, a material of the electron injection layer having a conduction band minimum energy; and
   a barrier layer between each of the electron injection layers and the quantum well, the barrier layers having a thickness sufficiently small to permit electrons to tunnel through the barriers and through the valence bands in the quantum well and having a biaxially strained epitaxial relationship with the material of the quantum well, the biaxial strain being sufficient to reduce the energy of the heavy holes in the quantum well to less than the energy of the conduction band minimum energy of the electron injection layers.

2. The tunnel diode of claim 1, wherein the quantum well is made of gallium antimonide with from about 1 to about 40 atomic percent arsenic therein.

3. The tunnel diode of claim 1, wherein the electron injection layers are made of indium arsenide.

4. The tunnel diode of claim 1, wherein the barrier layers are made of aluminum antimonide.

5. The tunnel diode of claim 1, wherein the quantum well is less than about 200 Angstroms thick.

6. The tunnel diode of claim 1, wherein the barrier layers are each less than about 40 Angstroms thick.

7. The tunnel diode of claim 1, wherein the quantum well contains a single layer of semiconducting material.

8. A double barrier tunnel diode, comprising:
   a device structure having
   a quantum well having at least one layer of an alloyed semiconductor material,
   a pair of electron injection layers on either side of the quantum well, the material of the electron injection layer having a conduction band minimum energy, and
   a barrier layer between each of the electron injection layers and the quantum well, the barrier layers having a thickness sufficiently small to permit electrons to tunnel through the barriers and through the valence bands in the quantum well and having an epitaxial relationship with the quantum well, an unalloyed material of the quantum well and a material of the barrier layer being such that the energy of heavy holes in the quantum well is greater than the conduction band minimum energy, wherein the semiconductor material of the quantum well is alloyed to produce a biaxially strained epitaxial relationship with the material of the barrier layer sufficient to reduce the energy of heavy holes in the quantum well to less than the energy of the conduction band minimum energy of the electron injection layers.

9. The tunnel diode of claim 8, wherein the quantum well is made of gallium antimonide with from about 1 to about 40 atomic percent arsenic therein.

10. The tunnel diode of claim 8, wherein the electron injection layers are made of indium arsenide.

11. The tunnel diode of claim 8, wherein the barrier layers are made of aluminum antimonide.

12. The tunnel diode of claim 8, wherein the barrier layers are each less than about 40 Angstroms thick.

13. The tunnel diode of claim 8, wherein the quantum well contains a single layer of semiconducting material.

* * * * *